(12) United States Patent
Oehrlein et al.

(10) Patent No.: US 7,470,329 B2
(45) Date of Patent: Dec. 30, 2008

(54) METHOD AND SYSTEM FOR NANOSCALE PLASMA PROCESSING OF OBJECTS

(75) Inventors: Gottlieb S. Oehrlein, Clarksville, MD (US); Xuefeng Hua, Hyattsville, MD (US); Christian Stolz, Baden-Wuerttemberg (DE)

(73) Assignee: University of Maryland, College Park, MD (US)

( * ) Notice: Subject to any disclaimer, the term of this patent is extended or adjusted under 35 U.S.C. 154(b) by 252 days.

(21) Appl. No.: 10/913,323

(22) Filed: Aug. 9, 2004

(65) Prior Publication Data
US 2005/0051517 A1   Mar. 10, 2005

Related U.S. Application Data

(60) Provisional application No. 60/494,539, filed on Aug. 12, 2003, provisional application No. 60/494,540, filed on Aug. 12, 2003.

(51) Int. Cl.
*C23C 16/00* (2006.01)
*C23F 1/00* (2006.01)
*H01L 21/306* (2006.01)

(52) U.S. Cl. .................................... 118/720; 156/345.3
(58) Field of Classification Search .............. 156/345.3; 118/720, 721
See application file for complete search history.

(56) References Cited

U.S. PATENT DOCUMENTS

| | | | | |
|---|---|---|---|---|
| 6,045,671 A * | 4/2000 | Wu et al. | ................ | 204/298.11 |
| 6,132,805 A | 10/2000 | Moslehi | | |
| 6,911,129 B1 * | 6/2005 | Li | .......................... | 204/298.11 |
| 2003/0075273 A1 * | 4/2003 | Kilpela et al. | ........... | 156/345.33 |

FOREIGN PATENT DOCUMENTS

JP          61235558 A    * 10/1986

* cited by examiner

*Primary Examiner*—Parviz Hassanzadeh
*Assistant Examiner*—Maureen G Arancibia
(74) *Attorney, Agent, or Firm*—Rosenberg, Klein & Lee

(57) ABSTRACT

A plasma processing system includes a source of plasma, a substrate and a shutter positioned in close proximity to the substrate. The substrate/shutter relative disposition is changed for precise control of substrate/plasma interaction. This way, the substrate interacts only with a fully established, stable plasma for short times required for nanoscale processing of materials. The shutter includes an opening of a predetermined width, and preferably is patterned to form an array of slits with dimensions that are smaller than the Debye screening length. This enables control of the substrate/plasma interaction time while avoiding the ion bombardment of the substrate in an undesirable fashion. The relative disposition between the shutter and the substrate can be made either by moving the shutter or by moving the substrate.

35 Claims, 14 Drawing Sheets

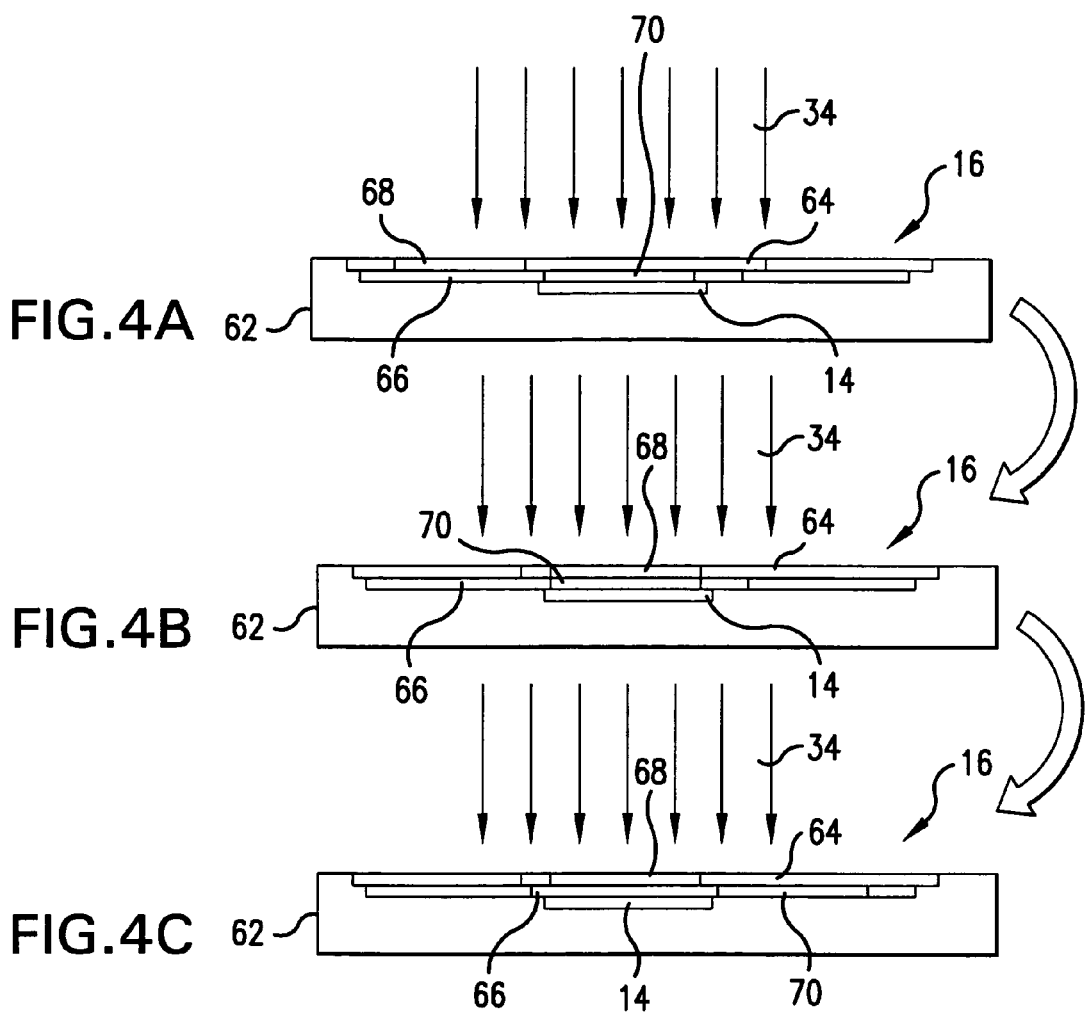

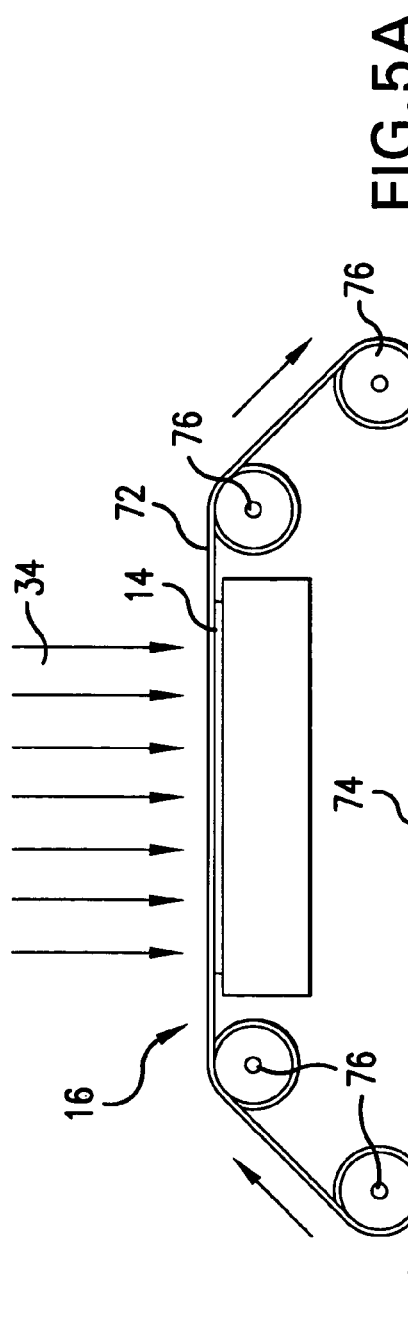
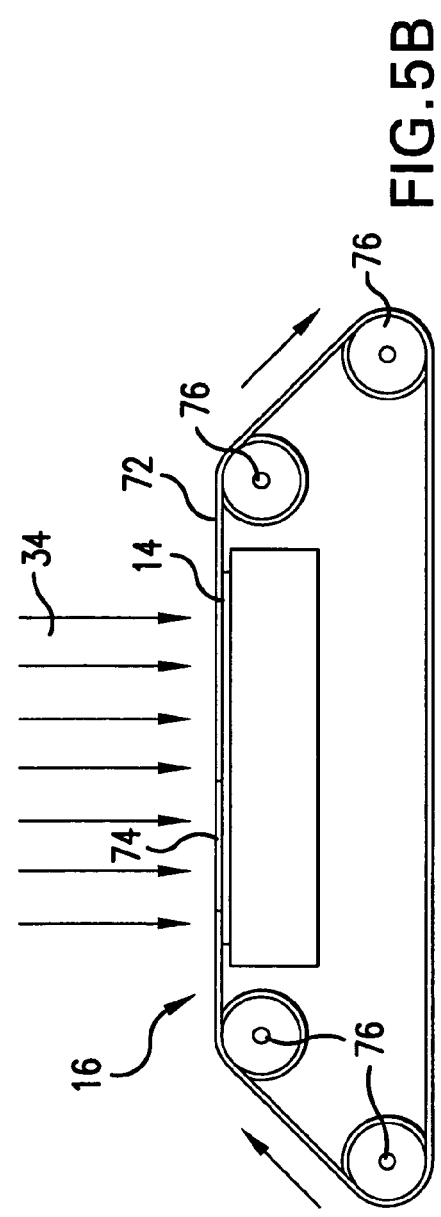
FIG.5A
FIG.5B

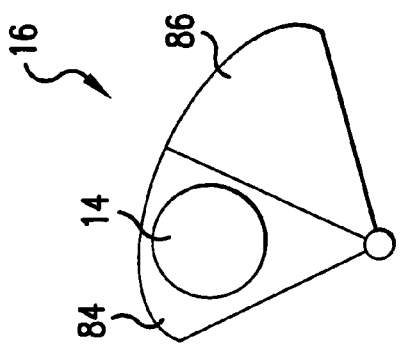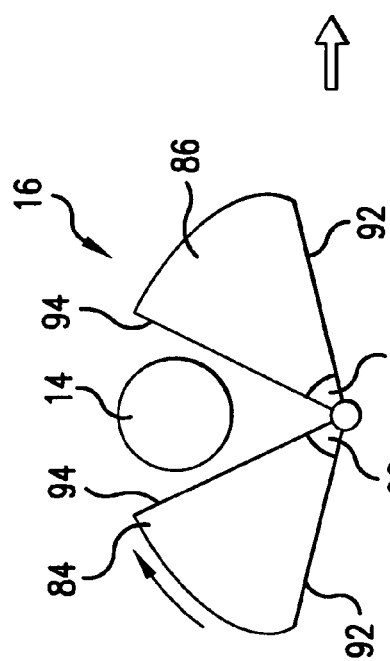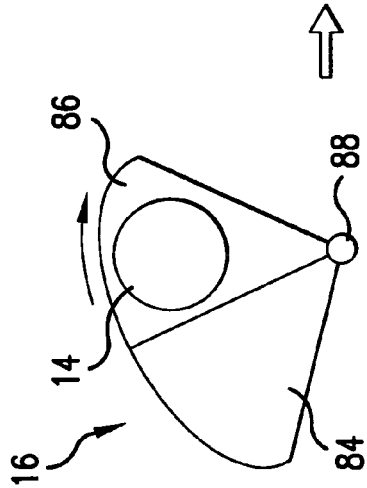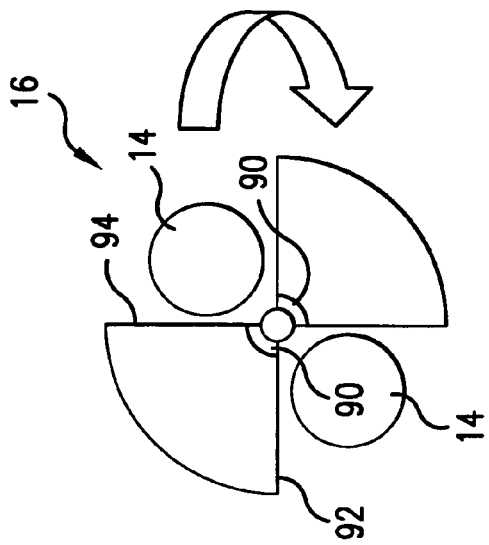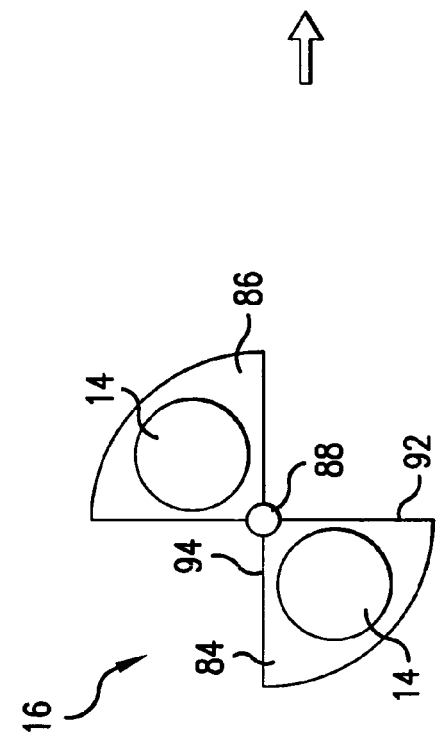

METHOD AND SYSTEM FOR NANOSCALE PLASMA PROCESSING OF OBJECTS

REFERENCE TO RELATED APPLICATION

The present Utility Patent Application is based on Provisional Patent Applications Nos. 60/494,539 and 60/494,540, both filed on 12 Aug. 2003.

This invention was made with Government Support under Contract Number FRS527430 awarded by the Department of Energy. The Government has certain rights in the invention.

FIELD OF THE INVENTION

The present invention relates to plasma processing of objects, and specifically to nanoscale processing of thin films and substrates by exposing the substrates to electrically charged plasmas for surface modifications.

In overall concept thereof, the present invention relates to processing of objects of micro-electronics, specifically for etching, deposition, etc. of thin films and substrates by plasma processing, and particularly to the control of the interaction time between the plasma and work pieces to assure optimum quality of the resulting structures.

In more detail, the present invention relates to a plasma processing system in which a shutter is positioned in a plasma processing chamber in close proximity to a work piece. The relative disposition between the shutter and the work piece is controlled to either shield the work piece from the plasma or to allow exposure of the work piece to the plasma for the desired interaction time when the plasma is fully established.

The present invention also relates to a shutter design in a nanoscale plasma processing system which is specifically patterned to form an array of sub-Debye screening length slits to enhance the control of the interaction between the plasma and the work piece. This is achieved by preventing the ion bombardment conditions of the work piece in an undesirable fashion which may be caused by a charge sheath surrounding the moving shutter in contact with the plasma.

BACKGROUND OF THE INVENTION

Plasma processes for micro-machining, surface modifications, cleaning, sputter coating, and many other operations are widely used in the fabrication of micro-electronics. The ionized gas in a plasma generates a high concentration of reactive species at 50-100 C, and provides a means of cleaning, etching, and depositing materials at much lower temperature than is possible by thermally driven reactions alone. A plasma may be considered as an ionized gas consisting of a "chemical soup" of many types of species, such as positive and negative ions, electrons, neutrals, atoms, molecules, clusters, etc. In laboratories, plasmas can be easily generated by striking a high voltage (normally larger than 1 kV) electrical discharge through a low pressure gas system. This may be achieved using a DC, AC, or more usually, high frequency AC operating in the kHz-MHz (radio frequency, RF), or GHz (microwave) regimes.

As known to those skilled in the art, a plasma reactor includes a plasma chamber with inlet and outlet for gas entrance and exit, as well as a pair of electrodes distanced one from another. A voltage difference is created between the electrodes. The discharge is initiated by an electron that originates from either photoionization of a neutral species or field emission caused by strong electric fields around a sharp point at the electrode surface. The applied electric field between the electrodes in the plasma reactor accelerates this electron causing it to undergo scattering collisions with gas molecules. As the electron accelerates, eventually it will possess enough KE to ionize a gas molecule through an inelastic collision. This process releases another electron, which itself begins to accelerate, thus initiating a cascade mechanism whereby other gas molecules are ionized in subsequent collisions. To sustain the plasma, electrons must be generated at a rate which is large enough to offset the loss of electrons to the chamber walls, recombination with positive ions and/or electron attachment reactions. Another mechanism which generates electrons is bombardment of the electrode surfaces by energetic particles (ions or electrons), which causes high energy secondary electrons to be ejected back into the plasma.

One of the features of a plasma is that while the bulk of the glow discharge remains at equipotential, most of the voltage applied between the electrodes is dropped across a small region surrounding any surface in contact with the plasma, and in particular the electrodes. This region is called the sheath (or "dark space"). The positive ions from the bulk of the plasma can be accelerated across this sheath and strike the electrode with high KEs. The voltage through which the ions are accelerated, and hence the KE with which they strike the substrate, depends upon many factors, including the applied power, the gas pressure in the plasma reactor, and the chamber geometry. As a consequence, a variety of plasma systems have been developed to exploit different ranges of these properties for different applications, specifically in microelectronics for fulfilling manufacturing steps, such as surface modification, etching, deposition, doping, etc.

Nanoscale processing of thin films and substrates by exposure to electrically charged plasmas is a desirable technology for surface modification and other changes of substrates. For plasma processing of nanoscale sized features, such as thickness, depth, and lateral dimensions, the control of the interaction time between the plasma and the work piece is of great importance. Typical etching or deposition rates using plasmas range from a fraction of nm/s to many nm/s. Because of the nanoscale thickness of the material layers that need to be added, modified or removed, the plasma/substrate interaction time has to be short. Simultaneously, a fully established plasma needs to interact with the work piece, rather than a plasma that is still evolving as a function of time, e.g., during the initial transient. This is especially important for chemical reactive discharges.

Current technology suffers from several disadvantages when applied to plasma processing of nanoscale layers. For instance, it is common that the substrate is in contact with the plasma during all phases of the plasma process such as initialization of the plasma, biasing of the substrate, desired plasma processing by plasma/substrate interaction, and plasma extinction. The beginning and the end of the desired plasma/substrate interaction are not well-defined in this approach. This is acceptable for the processing of thick layers, but not acceptable for plasma processing of layers with nanoscale dimensions. Any changes of the substrate introduced by the inadvertent interaction of the substrate with the plasma during one of the undesirable periods, such as initialization of the plasma, biasing of the substrate, stabilizing plasma, plasma extinction, and decay of long leaved neutrals, may reduce the efficacy of the plasma process. As an example, in a fluorocarbon (FC) based plasma etching process used to transfer lithography defined features into a film, fluorocarbon film deposition takes place after the plasma has been ignited but the RF bias has not been applied to the substrate electrodes. This deposition process can have unacceptable consequences for profile control of ultra-fine features.

Another drawback of the current plasma processing, is that the etching depth and/or film thickness of deposited films is not well controlled because of the sequential and additive effects of different regimes of the plasma/surface interaction. For plasma etching, this is dealt with by employing etch stop layers, in order that the plasma processing time can be increased to a period sufficient to guarantee the complete removal of the subject film. Obviously, this approach increases process complexity, and for plasma processing of substrates with nanoscale dimensions may be impractical, if not impossible.

In order to attain addition or removal of precisely controlled layer thicknesses of materials (nanoscale dimensions), tightly controlled plasma/surface interaction is desired. The attempt has been made in the plasma processing art to enhance process control. For example, U.S. Pat. No. 6,132,805 teaches the use of a moving shutter positioned within the processing chamber at a distance from a substrate. The shutter is activated to interrupt plasma/substrate interaction when needed. A plasma can be generated between the shutter and the substrate for the substrate cleaning. A second plasma exists between the shutter and a remote electrode. With the shutter initially closed, both plasmas are established. After a certain amount of time, the shutter is removed, and the second plasma is allowed to interact with the substrate for the deposition of a thin film.

The disadvantage of the thin film processing equipment described in the U.S. Pat. No. 6,132,805, is that the shutter is located an extended distance from the substrate, and the system uses the plasma generation between the shutter and the substrate. This is undesirable for nanoscale plasma processing where the exposure time of the substrate to any kind of plasma or reactive environment must be precisely controlled. This control of the short time interaction of a substrate with a fully established and stable plasma is not possible in the system described in the U.S. Pat. No. 6,132,805 since the existence of a large volume between the shutter and the substrate causes appreciable changes in the plasma once the shutter is removed from the substrate for processing.

Another deficiency of the prior plasma processing techniques is that if a microscopic shutter is used to control the exposure time of the substrate to a plasma, either by movement of the shutter or of the substrate relative to the shutter, a sheath will form at the surfaces of the shutter. This sheath changes both the energies and angles at which incident ions bombard the surface of the substrate in the shutter/sheath area. The problem is that orientation of the sheath may be directed parallel to a normal of the substrate which prevents the ion bombardment of the substrate. The use of the microscopic shutters in the plasma processing becomes problematic if a very short time exposure of a substrate to the plasma is required, i.e., for nanoscale layer processing or for diagnostics of the plasma. For such conditions the interaction of the substrate with a perturbed species and energy flux from the plasma may become dominant. It is therefore desirable to develop a plasma processing technique in which the effect of the sheaths surrounding the shutter in contact with plasma will be obviated.

The plasma processing for nanoscale micro-electronics with an enhanced process control which would allow a precisely controlled short time interaction of a substrate with a fully established and stable plasma is therefore a long lasting need in nanoscale device fabrication.

SUMMARY OF THE INVENTION

It is therefore an object of the present invention to provide nanoscale plasma processing of a workpiece which permits control of interaction time between a workpiece and a fully established stable plasma.

It is another object of the present invention to provide a plasma processing system in which a shutter is positioned in close proximity to a workpiece, and where the relative disposition between the shutter and the workpiece is tightly controlled to provide the desired area of the workpiece to be exposed to a fully established plasma for a short period of time for specific manufacturing purposes, such as etching, modifying the surface of the workpiece, or for deposition of a thin layer material.

It is a further object of the present invention to provide a shutter arrangement in the plasma processing reactor in which a shutter is patterned to form an array of slits with the widths of sub-Debye screening length in order to avoid unwanted effects of the sheath surrounding the moving shutter.

In one aspect, the present invention is directed to a method for nanoscale plasma processing of objects, such as substrates, thin films, etc., used in micro-electronics, which includes the steps of:

positioning a shutter in the plasma processing chamber in close proximity to the workpiece, igniting the plasma, and actuating the relative motion between the shutter and the workpiece in order to control the workpiece/plasma interaction time.

It is important that the interaction between the substrate (workpiece) and the plasma be affected only when the plasma is in its fully established stable state.

It is possible to move the shutter with regard to the substrate, or the substrate with regard to the shutter. The shutter is preferably a silicon-based shutter having one opening of a predetermined size. This opening scans the surface of the object to be plasma processed at a predetermined velocity and in a predetermined direction. Shutters with openings of different dimensions can be used in the system of the present invention. By coordinating the width of the opening made in the shutter with the velocity of scanning the surface of the substrate with the opening, the present invention permits precise control of the depth of etching, extension of modification of the surface of the workpiece, and/or the thickness of the deposited thin film on the surface of the workpiece.

As another aspect of the present invention there is provided a plasma processing system which includes a plasma reactor (plasma processing chamber), a source of plasma for creating plasma in the plasma processing chamber, a substrate, and a shutter assembly which controls the interaction between plasma and the substrate. The source of plasma (also referred to herein as a plasma generating unit) which may be based on any kind of plasma generation method including, but not limited to, producing plasmas at atmosphere pressure, dielectric barrier discharge, microhollow cathode discharge, etc. The plasma source also may be based on such approaches of plasma generation as capacitively coupled plasma, inductively coupled plasma, electron cyclotron resonance plasma, Helicon wave plasma, high frequency capcitively coupled plasma, microwave plasma, hollow cathode plasma, electron beam generated plasma, remote plasma source, and others.

In one of the implementations, a pair of electrodes which are spaced one from another which are biased one with respect to the other in order to create an electric field therebetween sufficient to ignite and sustain plasma between the electrodes.

One of the electrodes consists of the substrate and the shutter which is positioned in close proximity to the substrate (the distance between the shutter and the substrate may range between 0 and 1 mm) and displaceable with respect thereto. A translating unit in the system is operationally coupled either to the substrate or to the shutter (or to both) in order to provide change of the relative disposition therebetween. It is within the scope of the present invention that either the shutter may move with respect to the substrate or the substrate is displaceable with respect to the shutter (or the shutter and the substrate may be moved simultaneously).

Although other power sources may be used for igniting and sustaining the plasma in the plasma reactor, it is possible that the plasma is ignited and sustained by an RF power source coupled to one of the electrodes, with preference given to the electrode consisting of the shutter and the substrate.

The shutter may be made of Ni, $SiO_2$, $Si_3N_4$, Al, $Al_2O_3$, and anodized Al, etc. The shutter includes an opening formed therein for scanning over the object of the plasma processing with a predetermined velocity to provide object/plasma interaction at a desired area of the object (workpiece).

The shutters may be used having openings of different widths. In the system of the present invention, coordination is used between the widths of the openings and the velocity of movement between the shutter and the substrate to control the object/plasma interaction.

In order to avoid unwanted effects introduced by a sheath surrounding the shutter when in contact with the plasma the shutter is patterned to form an array of slits each with the width of sub-Debye screening length.

The shutter can be implemented in several forms, including a belt having an opening, a linear shutter with one or more blades, an axial shutter with one or more blades, etc.

In the system of the present invention, a rapidly moving shutter (or substrate) is used in close proximity to the substrate to control the substrate/plasma interaction time. The substrate is located behind the shutter, both of which represent an electrode and can be biased relative to the plasma. The shutter is part of the electrode and prevents exposure of the wafer to the plasma when this interaction is not desired. Once the plasma and the plasma surface interaction consequences are fully established in the desired state, e.g., the plasma source power and substrate biasing power are at desired levels, the shutter is rapidly removed from the substrate (or the substrate is rapidly removed from the shutter) to expose the substrate to the plasma for the desired interaction time.

At the end of the desired plasma interaction time, the substrate is shielded from further exposure to the plasma by moving the shutter (or the substrate) back into its original position. Alternatively, with a slit formed in the shutter, a controlled linear motion of the shutter and/or substrate will be sufficient to prevent exposure of the substrate to the plasma at undesired periods. This approach enables precise, short time, nanoscale plasma processing. The shutter is positioned in close proximity to the substrate (about 0-1 mm therebetween) in order to minimize, or completely eliminate, the volume located between the shutter and the substrate. In this fashion, the change in volume that the plasma experience when the shutter is removed is minimized, and the plasma properties remain nearly constant. The present invention enables the interaction of the substrate with a fully established, well-defined, stable plasma for tightly controlled exposure times (from fractions of a second to many seconds) required for nanoscale processing of materials.

These features and advantages of the present invention will be fully understood and appreciated from the following detailed description of the invention in conjunction with the accompanying Drawings.

BRIEF DESCRIPTION OF THE DRAWINGS

FIGS. 4A-4C is a schematic diagram illustrating a linear shutter with two blades;

FIGS. 5A-5B depict a shutter belt with an opening formed therein for scanning over the surface of the substrate;

FIGS. 7A-7E illustrate an axial shutter with two or more blades;

DETAILED DESCRIPTION OF THE PREFERRED EMBODIMENTS

Figure 1A:
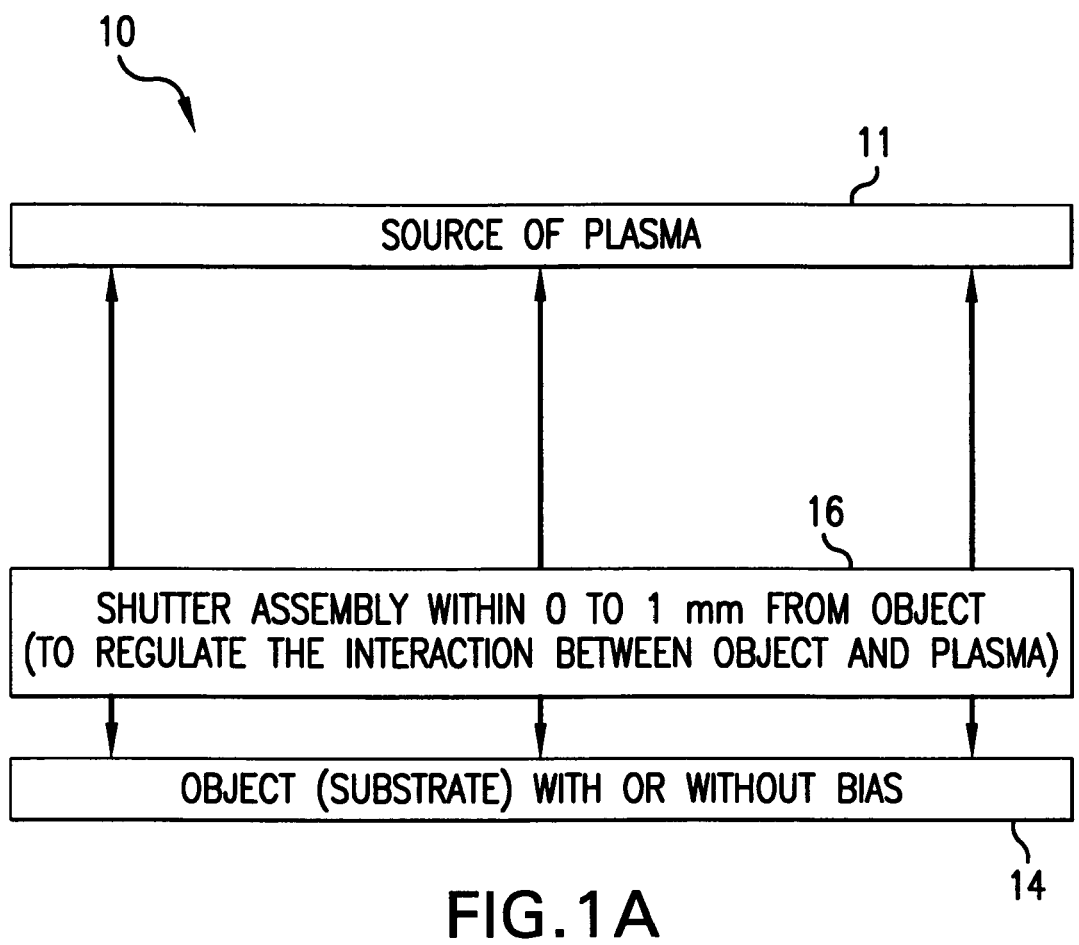
FIG. 1A is a schematic representation of the operational principles of the plasma processing system of the present invention.
Figure 1B:
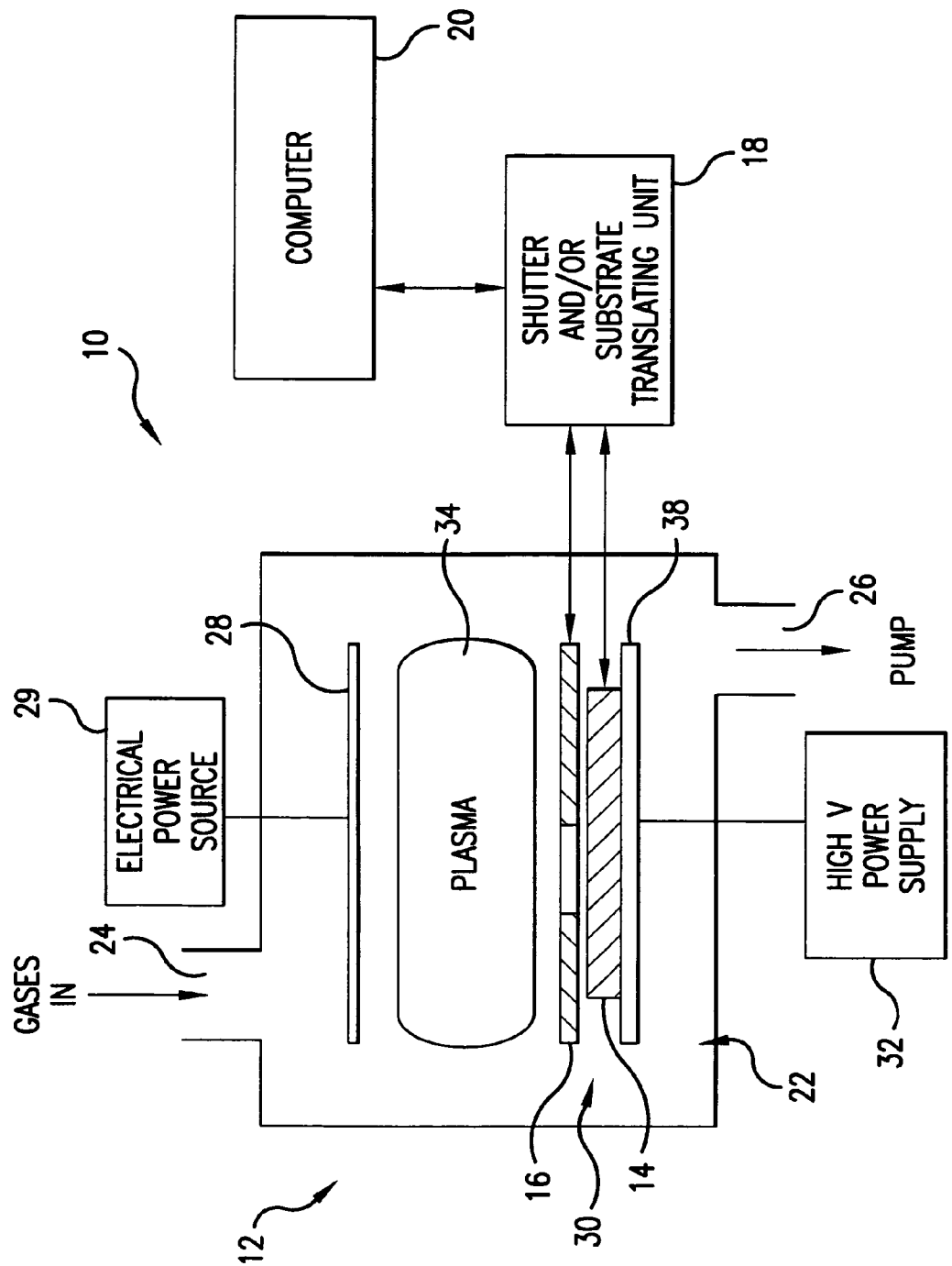
FIG. 1B is a schematic representation of one of the embodiments of the system of the present invention.

Referring to FIGS. 1A and 1B, there is shown a system 10 for nanoscale plasma processing of a workpiece including a source of plasma 11 (also referred to herein as plasma generating unit), a plasma reactor 12, the details of which will be presented infra herein; a workpiece 14, also referred herein as a substrate or an object; a shutter assembly 16 in close proximity or in contiguous relationship with the substrate 14; a shutter and/or substrate translating unit 18; and a computer 20 controlling the operation of the system 10. The plasma reactor 12 includes a plasma processing chamber 22 filled with gas molecules (for example, Ar) passing through a gas inlet 24. As an example, the reactive gas pressure within the plasma processing chamber 22 may be maintained at between approximately 1 mTorr and 10 Torr. Also, atmospheric pressure discharges are contemplated in the system of the present invention for many low-tech materials. The pressure parameters discussed supra are an example of many possible pressure ranges applicable in the system and method of the present invention; and for those skilled in the art, applicability to plasmas produced at different pressures is readily evident. The reactive gas exits from the plasma processing chamber 22 through a gas outlet 26. The proximity between the substrate 14 and the shutter 16 is maintained in the range of approximately 0-1 mm.

The plasma generating unit 11 may be based on any kind of plasma generation method including, but not limited to, generation of capacitively coupled plasma, inductively coupled plasma, electron cyclotron resonance plasma, Helicon wave plasma, high frequency capacitively coupled plasma, microwave plasma, hollow cathode plasma, electron beam generated plasma, etc. It may also be based on dielectric barrier discharge, microhollow cathode discharge, etc. The plasma may be produced at a wide range of pressures, including atmospheric pressure, and may represent a remote plasma source in addition to a plasma source embedded into the plasma reactor.

As one of the examples, and not for limiting the scope of the present invention, the plasma processing system 10 based on capacitively coupled plasma generation approach is shown in FIG. 1B, wherein a system of electrodes 28 and 30 are positioned within the plasma processing chamber 22 at a predetermined distance therebetween. In order to create an electrical field between the electrodes 28 and 30, the electrode 28 is powered by an electrical power source 29, and the electrode 30 is biased with regard to the electrode 28 by a high voltage power supply 32 coupled to the electrode 30. It is clear to those skilled in the art that other, alternative, plasma generation and biasing and non-biasing schemes may be used as well in the system of the present invention to create the plasma in the plasma processing chamber 22. As shown in FIG. 1B, the electrode 30 may consist of the substrate 14 and the shutter 16 positioned in contiguous contact or in close proximity with the substrate 14.

The plasma 34 is generated by striking a high voltage, for example, more than 1 kV, electrical discharge through the low pressure plasma processing chamber from the power supply 32 which may be a DC, AC, radio frequency, or microwave frequency power supply.

Figure 2:
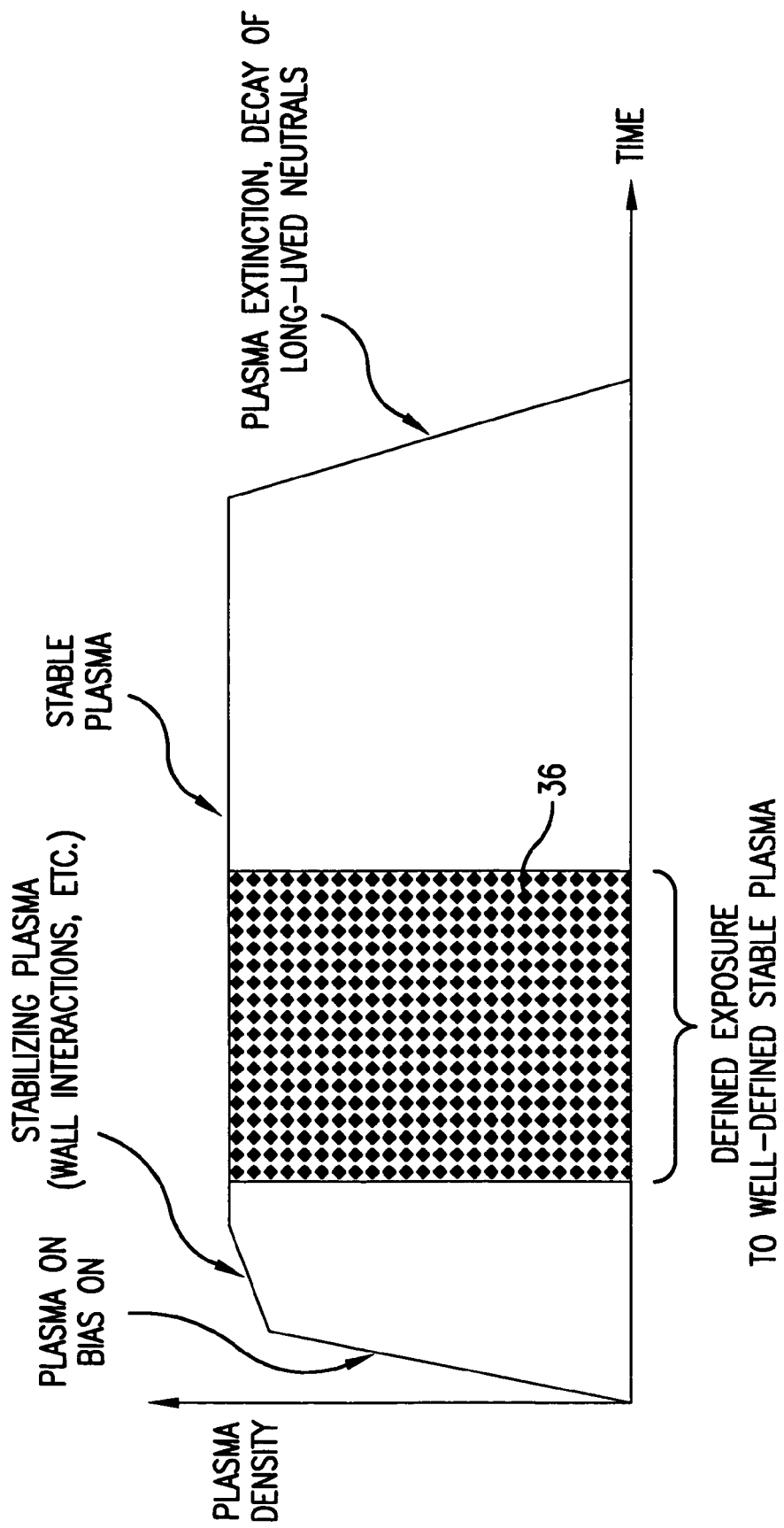
FIG. 2 is a diagram representing the dynamics of the plasma and shows the area of the stable plasma state where the substrate/plasma interaction is permitted for nanoscale processing of materials according to the principles of the present invention.

As shown in FIG. 2, the dynamics of plasma development passes through several stages including initialization of the plasma, biasing of the substrate/shutter, stabilizing plasma region, stable plasma, and plasma extinction. For plasma processing of nanoscale sized features, in the system of the present invention, the plasma/substrate interaction time has to be short. A fully established plasma interacts with the workpiece, rather than a plasma that is still evolving as a function of time, e.g., during the initial transient which is especially important for chemical reactive discharges. As shown in FIG. 2, only a region 36 where the plasma is in a well-defined stable state is used for exposure of the substrate to the plasma. For this, the relative lateral disposition between the shutter 16 and the substrate 14 is controlled by the computer 20 through the translating unit 18 to allow the exposure of the substrate to the plasma only during the region 36 shown in FIG. 2 while shielding the substrate by the shutter during all other stages of the plasma life.

It is to be understood that the lateral relative disposition between the substrate 14 and the shutter 16 may be changed either by displacing the shutter with respect to the immovable substrate or by displacing the substrate with respect to a shutter. Alternatively, both the shutter and the substrate may be displaced under the control of the computer 20. For the sake of simplicity, the operation of the system 10 of the present invention will be described with the shutter translated by the translating unit 18 with respect to the substrate, although other alternative options are considered in the scope of the present invention.

The rapidly moving shutter 16 is used in close proximity to the substrate 14 to control the substrate/plasma interaction time. The substrate 14 is located behind the shutter 16 where both the substrate 14 and the shutter 16 are biased relative to the plasma 34. The shutter 16 (as well as the substrate 14) is a part of the electrode 30 and functions to prevent exposure of the substrate to the plasma when it is desired not to have substrate/plasma interaction.

Once the plasma and the plasma/shutter interaction are fully established in the desired plasma state, wherein the plasma source power and the substrate biasing power are at desired levels, the shutter 16 is rapidly removed from the original position (in which the shutter shields the substrate from the plasma) to expose the substrate to the plasma for the desired interaction time. At the end of the desired plasma interaction time, the substrate 14 is shielded again from further exposure to the plasma by moving the shutter 16 back into its original position. This approach enables precise, short time, nanoscale plasma processing of the substrate 14.

Due to close proximity (or even direct contact) between the shutter and the substrate in the range of 0-1 mm, the plasma experiences no changes in volume when the shutter is removed, and thus the plasma properties remain undisturbed by movement of the shutter. The system of the present invention enables the interaction of the substrate with a fully established, well-defined, stable plasma, as presented in FIG. 2, for tightly controlled exposure times, from fractions of a second to many seconds required for nanoscale processing of materials.

The implementation of the translation of either a substrate with respect to the shutter or the shutter with respect to the substrate may be arranged in a variety of manners. As an example, the substrate can be positioned on a translating stage 38 which moves in X-Y directions by the translating unit 18 under the control of the computer 20. This arrangement is well-known in the art of workpiece processing and is not described herein in detail.

The movement of the shutter 16 with regard to the substrate 14 depends on the design of the shutter and will be described in detail infra herein. Referring to FIGS. 3A-7E, different designs of the shutter are contemplated in the system of the present invention including linear shutters with one or more blades, belt-like shutters, axial shutters with one or more blades, etc.

Figure 3A:
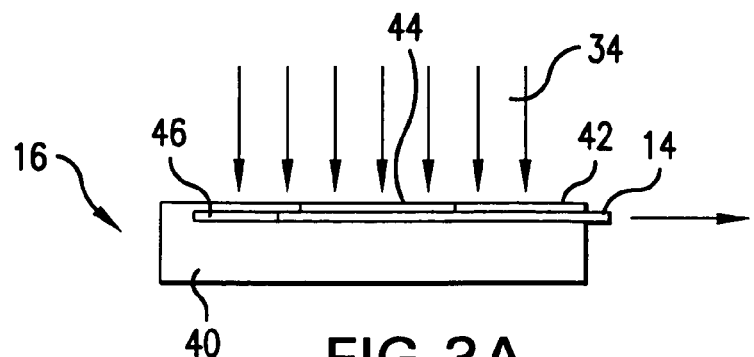
FIGS. 3A-3C is a schematic diagram illustrating a linear shutter with one blade.

For instance, as shown in FIG. 3A, a shutter includes a base 40 and a blade 42 with an opening 44 formed therein. The substrate 14 is positioned in the slit 46 formed between the base 40 and the blade 42 and reciprocally is displaced within the slit 46. The relative movement between the substrate 14 and the opening 44 formed in the blade 42 of the shutter 16 can be accomplished either by moving the substrate by means of the translating unit 18 or by keeping the substrate immovable and moving the shutter 16, by actuation of the translating unit 18 controlled by the computer 20. The opening 44 scans over the surface of the substrate 14 providing an interaction between the plasma 34 and the desired areas on the substrate 14. Depending on the velocity of scanning of the opening 44 over the substrate 14, exposure time and the width of the opening 44, a desired depth of plasma etching, or depositing of a desired thickness of a thin film on the surface of the substrate, may be achieved. The computer 20 coordinates the velocity of the relative movement between the substrate and the shutter with the exposure time in view of the width of the opening 44. This attains the desired plasma processing characteristics of the process and the extent of the substrate's surface transformation.

Figure 3B:
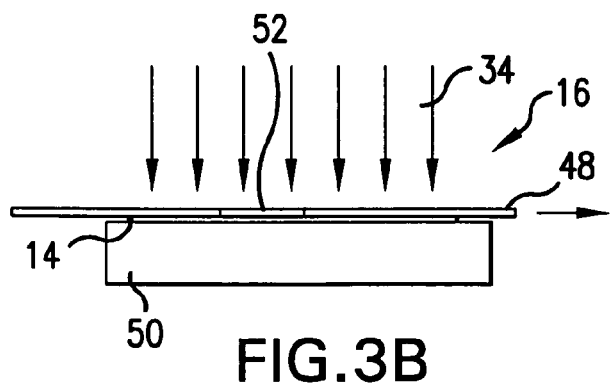

Referring to FIG. 3B, showing another shutter/substrate arrangement, a blade 48 of the shutter 16 linearly moves with respect to the substrate 14 which is located on a substrate holder 50. The exposure of the substrate to the plasma is fulfilled through the opening 52 formed in the blade 48. In this embodiment shown in FIG. 3B, the shutter 16 moves with respect to the substrate 14 by the translating unit 18 which for these purposes is provided with a linear or rotational motor (not shown) which is operationally coupled to the blade 48 and is actuated by the computer 20 to pull the blade 48 with a predetermined velocity and in a predetermined fashion.

Figure 3C:
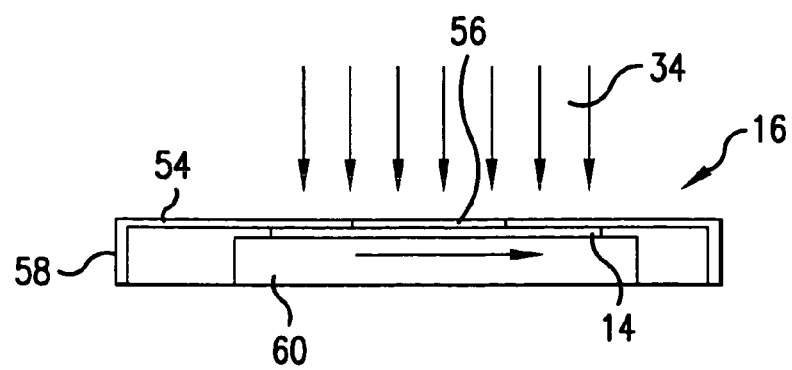

With regard to FIG. 3C, another alternative substrate/shutter arrangement is shown, in which the shutter has a top portion 54 having an opening 56 formed therein and the sidewalls 58 within which the substrate 14 is displaced relative to the opening 56 when the substrate support 60 is actuated by the translating unit 18 under the control of the computer 20.

Shown in FIGS. 4A-4C, is an alternative design of the shutter 16, which represents a linear shutter with a pair of blades. The substrate/shutter arrangement in accordance with the design shown in FIGS. 4A-4C, includes a support 62 patterned to form a recess for supporting the substrate 14 and a pair of blades 64 and 66. The blade 64 has an opening 68, while the blade 66 has an opening 70 formed therein. As shown in FIG. 4A, in the original shutter position, the opening 70 of the blade 66 is aligned with the substrate 14. However, opening 70 is shuttered by the blade 64 since the opening 68 is displaced from the opening 70 of the blade 66. In this manner, the substrate 14 is prevented from exposure to the plasma 34. Further, as shown in FIG. 4B, the position of the upper blade 64 has been changed so that the openings 68 and 70 of the blades 64 and 66, respectively, are both aligned with the substrate 14 in order to attain the plasma/substrate interaction through the aligned openings 68 and 70. As further shown in FIG. 4C, the lower blade 66 is moved to displace the opening 70 thereof from the substrate. In this manner, the substrate is once again shuttered from the plasma by the blade 66.

In another implementation of the shutter/substrate arrangement, shown in FIGS. 5A and 5B, the shutter is implemented in the form of a belt 72 having an opening 74 formed at a predetermined area thereof. The belt 72 is installed on rolls 76. The rolls are operationally coupled to the translating unit 18 which rotates the roll under the control of the computer 20 at a predetermined velocity in a predetermined direction, thereby controlling the relative disposition between the opening 74 of the belt 72 and the substrate 14.

Figure 6A:
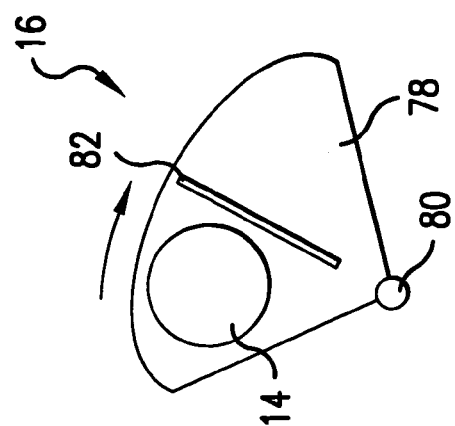
FIGS. 6A-6C illustrate an axial shutter with one blade.
Figure 6B:
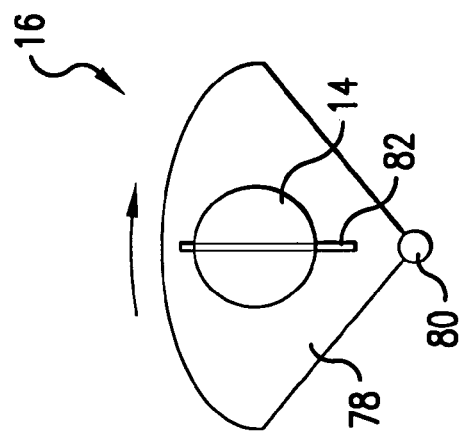
Figure 6C:
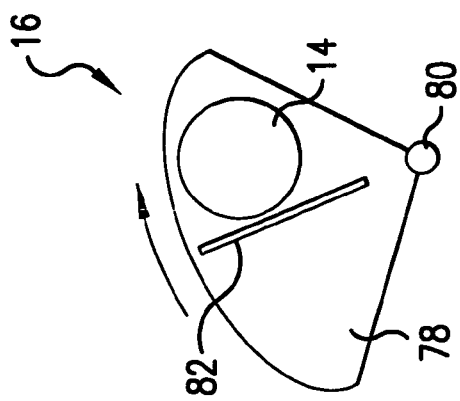

Shown in FIGS. 6A-6C, is another alternative embodiment of the shutter of the present invention which is an axial shutter with one blade. The shutter shown in FIGS. 6A-6C, includes a blade 78 which is rotated about the axis 80. For this purpose, the translating unit 18, is provided with a motor (not shown) operationally coupled either to the blade 78 or to a rod coinciding with the axis 80 in order to rotationally actuate the blade 78 with an angular rotational velocity controlled by the computer 20. The blade 78 has at least one slit 82 which during the rotation of the blade 78 about the axis 80, scans the surface of the substrate 14 (shown as a circular area in FIGS. 6A-6C). By aligning the slit 82 with a predetermined area of the substrate 14 and maintaining position for a predetermined time or scanning the slit with a predetermined velocity, the exposure of the substrate 14 to the plasma provides a controlled substrate/plasma interaction time to attain a desired processing of the substrate 14.

Referring to FIGS. 7A-7E, another alternative embodiment of the shutter 16 of the present invention is shown which represents an axial shutter with two or more blades. In this embodiment, the shutter 16 includes blades 84 and 86 which rotate about rotational axis 88. The size of the blades 84 and 86, the relative disposition, and the velocity of the rotation of each permits precise control of the interaction time between the substrate 14 and the plasma.

The shutter 16 shown in FIGS. 7A-7C, includes two blades 84 and 86 with the acute angle 90 formed between the edges 92 and 94 of each of the blades. As shown in FIG. 7A, the substrate 14 is prevented from exposure to the plasma by the blade 86. In FIG. 7B, the blade 86 is rotated to the right where the substrate 14 is seen to be between the blades 84 and 86 thereby exposing the substrate 14 to the plasma. Further, as shown in FIG. 7C, the blade 84 rotates to the right to shield the substrate 14 against the interaction with the plasma.

Shown in FIGS. 7D and 7E, is an alternative embodiment where the blades 84 and 86 form a right angle for angle 90 between the edges 92 and 94. In this embodiment the exposure of two substrates 14 to the plasma may be simultaneously controlled.

The shutters may be made of Ni, Si, $Si_3N_4$, $SiO_2$, Al, $Al_2O_3$, anodized aluminum, etc., and may have a thickness in the range of 1 μm-1 mm.

An experiment has been performed where silicon-based shutters were moved at fixed velocities (in the range of 0.001 m/s-10 m/s) across silicon wafers coated with a $SiO_2$ film. The silicon-based shutters contained openings of different widths (in the range between 0.1 mm and 50 mm). Both the shutter 16 and the $SiO_2$ coated Si wafer 14 were RF biased and the plasma was operated for a predetermined time (in the order of a few minutes) to establish a stable state operating condition. The combination of lateral shutter speed and opening width permits precise control of the plasma/substrate interaction time with a fully established well-defined plasma.

Figure 8:
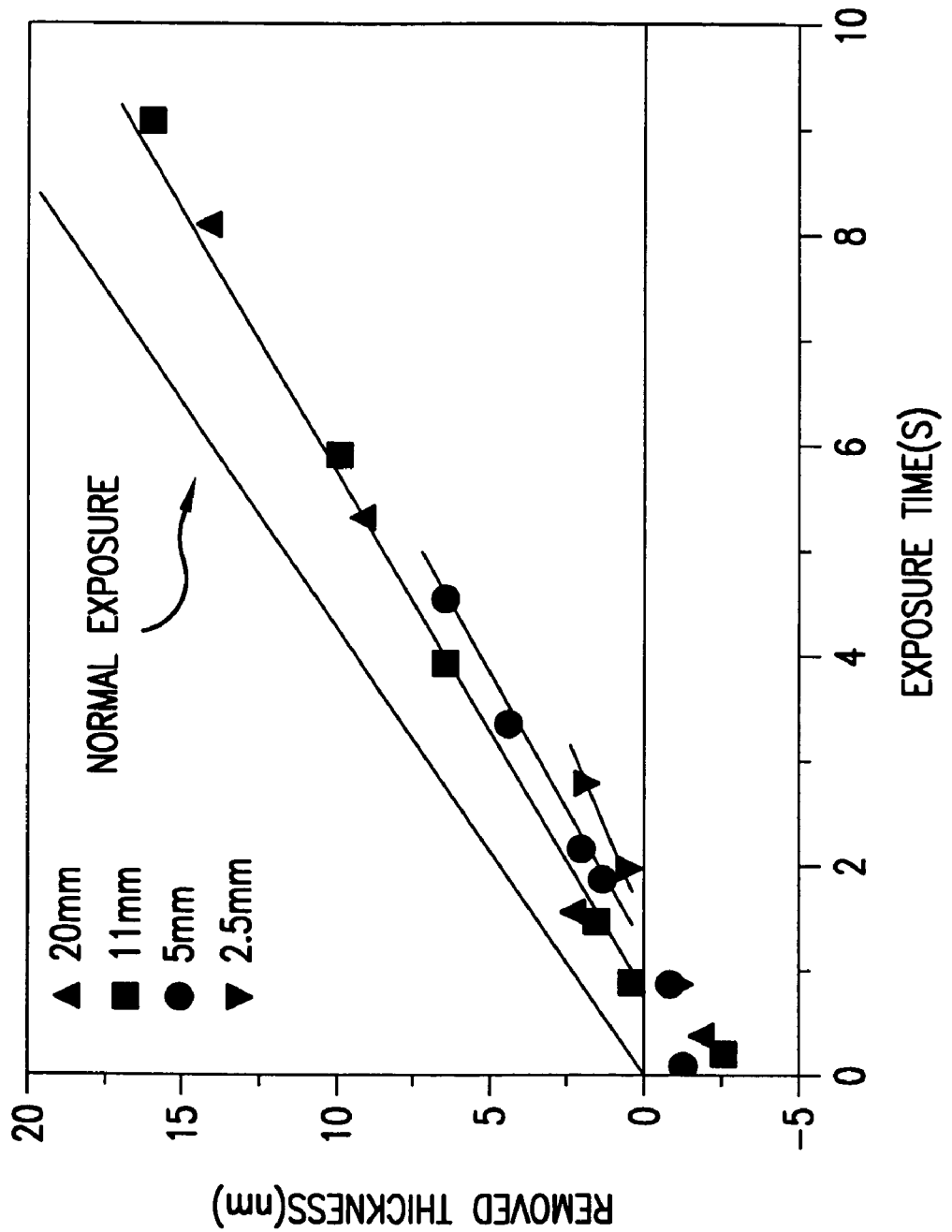
FIG. 8 is a diagram showing processed data for $SiO_2$ etching in a fluorocarbon plasma for very short plasma processing times through shutters with slits of different widths, ranging between 2.5 and 20 mm.

FIG. 8 is directed to process data results for $SiO_2$ etching in a fluorocarbon (FC) plasma for short plasma processing times. The stable state $SiO_2$ etching rate measured for continuous exposure of a biased $SiO_2$ surface of the substrate to the FC plasma and the measured etching rate was used to calculate the thickness of the layer removed. Additionally shown in FIG. 8 is the $SiO_2$ layer thickness removed by exposure of the RF biased $SiO_2$ layer to the fluorocarbon plasma through shutters with slits of different widths (ranging from 2.5 mm to 20 mm). In this experiment, the shutters traveled at different speeds over the $SiO_2$ film, thus allowing different exposure times. The diagram of FIG. 8 shows that as the slit width is reduced and the exposure time of the substrate to the fluorocarbon (FC) plasma is decreased, the deviation of the thickness of $SiO_2$ layer removed from that measured for stable state etching increases. For the shortest exposure time, no etching is observed, however there is fluorocarbon film deposition.

Figure 9:
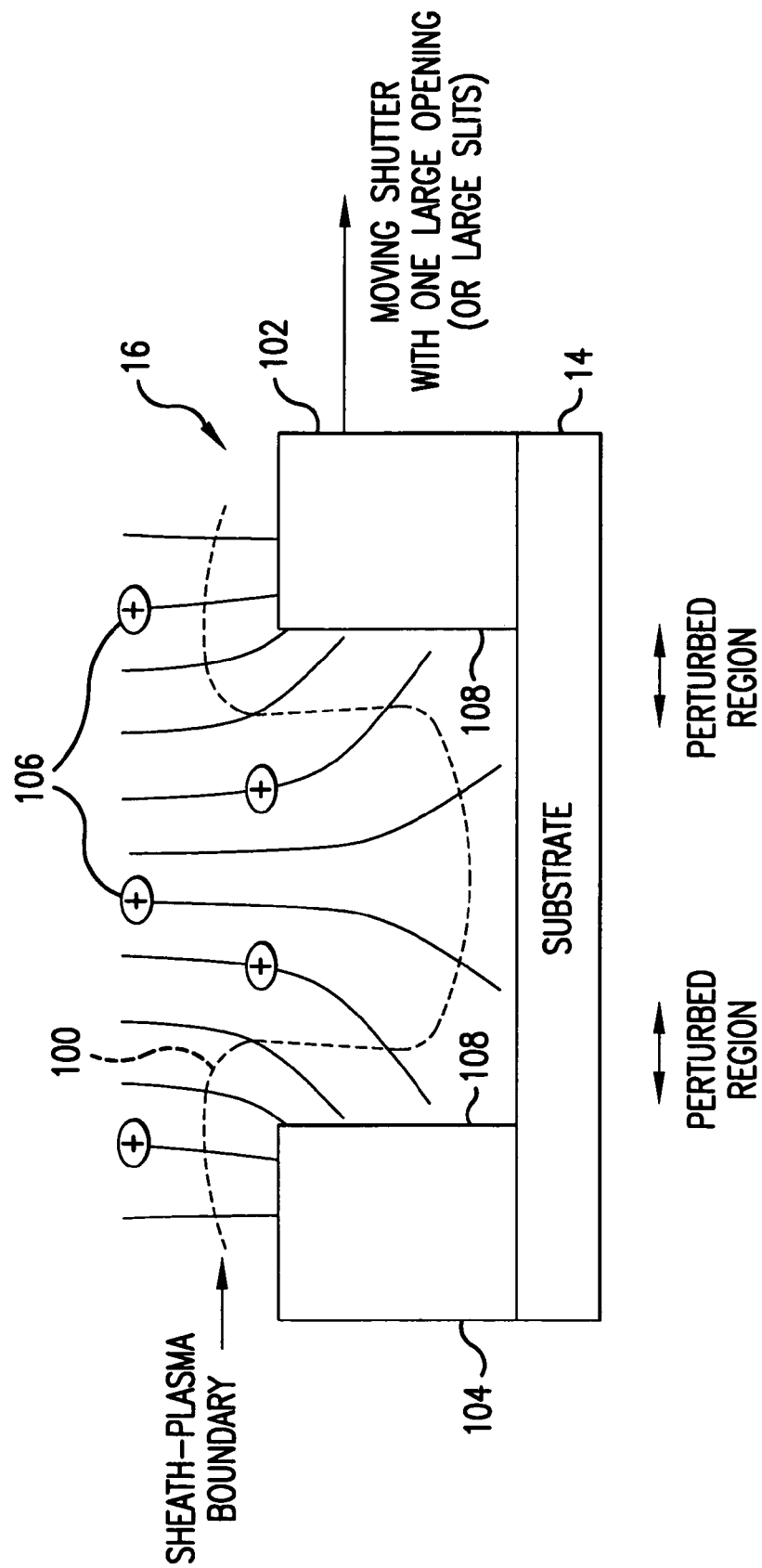
FIG. 9 is a schematic representation of interaction between plasma, shutter, and the substrate depicting a sheath introduced at the leading and trailing edges of a moving shutter with large opening dimensions.

The following mechanisms explain the dependence of the amount of $SiO_2$ removed on the slit widths, despite a constant amount of time of exposure to the plasma. Inherent to a moving shutter or any surface in contact with a plasma, is the surrounding of the shutter or the solid surface with a space charged sheath 100, best shown in FIG. 9. The sheath 100 is introduced at the leading edge 102 and trailing edge 104 of the moving shutter 16 having microscopic dimensions.

The sheath 100 at the boundaries of the shutter changes the plasma surface interaction with the substrate 14 since ions 106 will be deflected towards the vertical sidewalls 108 of the shutter 16, and the ion/neutral ratio at the substrate surface portions located in proximity to the shutter sidewalls 108 will be changed.

Figure 10:
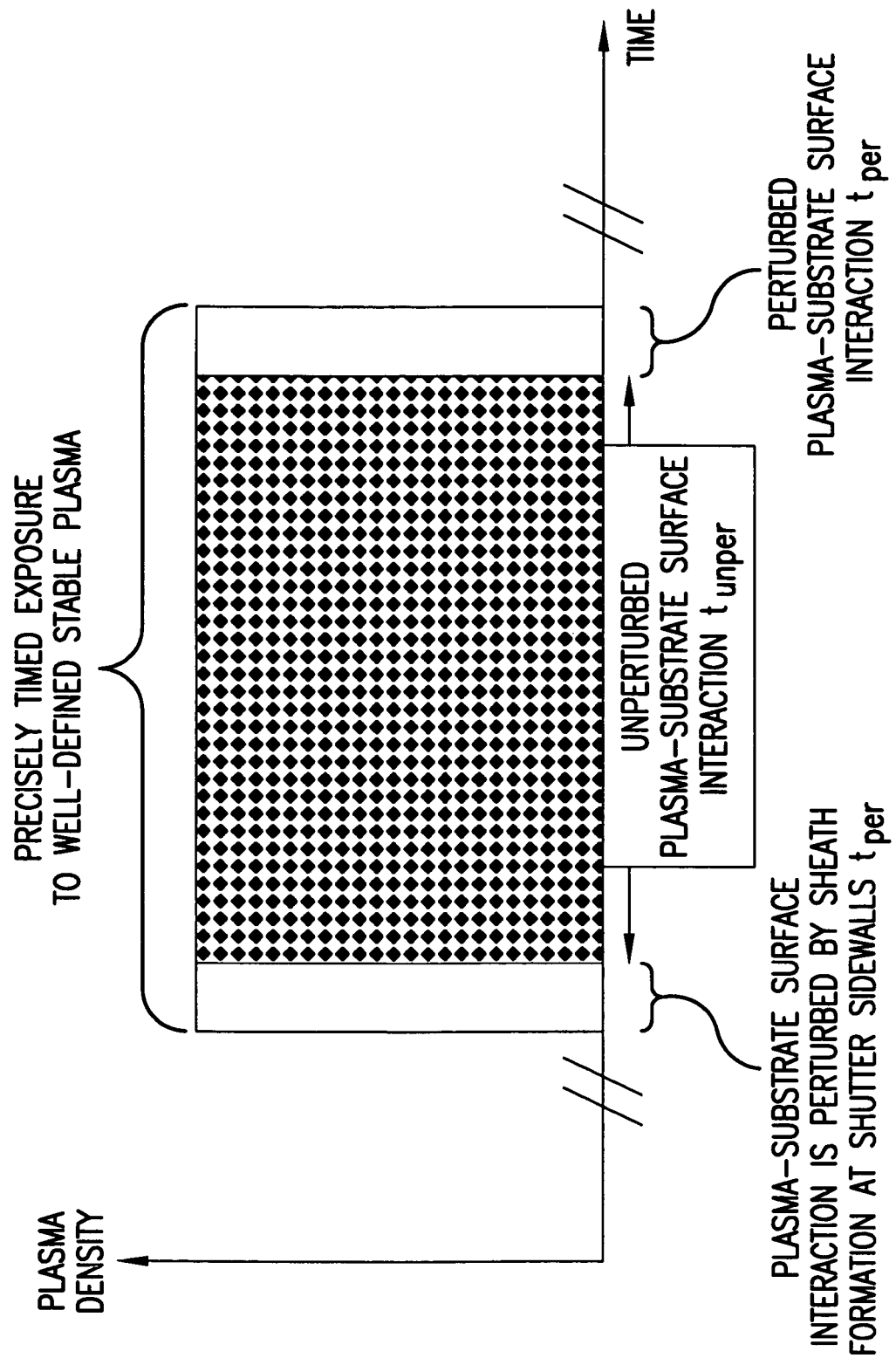
FIG. 10 is a diagram illustrating the unperturbed and perturbed plasma/substrate interaction regions formed as the shutter moves across the substrate.

A region exists near the edges of the shutter where the plasma surface interactions with the substrate will be different than those seen in open areas due to reduced ion/neutral ratio and energy flux. As the perturbed boundary region of the shutter moves across the substrate, the substrate surface will experience a brief period $t_{per}$ of changed species and energy flux from the plasma at the beginning and the end of the exposure as shown in FIG. 10. The remainder of the exposure period will be substantially the same as the plasma/surface interactions taking place in the large open areas, shown as the period $t_{unper}$. The perturbation $t_{per}$ is especially important for plasma processing of ultra-thin layers required for nanoscale technology as clearly seen in FIG. 8 where the relative importance of the perturbation is most pronounced for the shortest times and smallest slit openings. For this, the time period between the perturbed periods of plasma processing becomes negligible.

Figure 11:
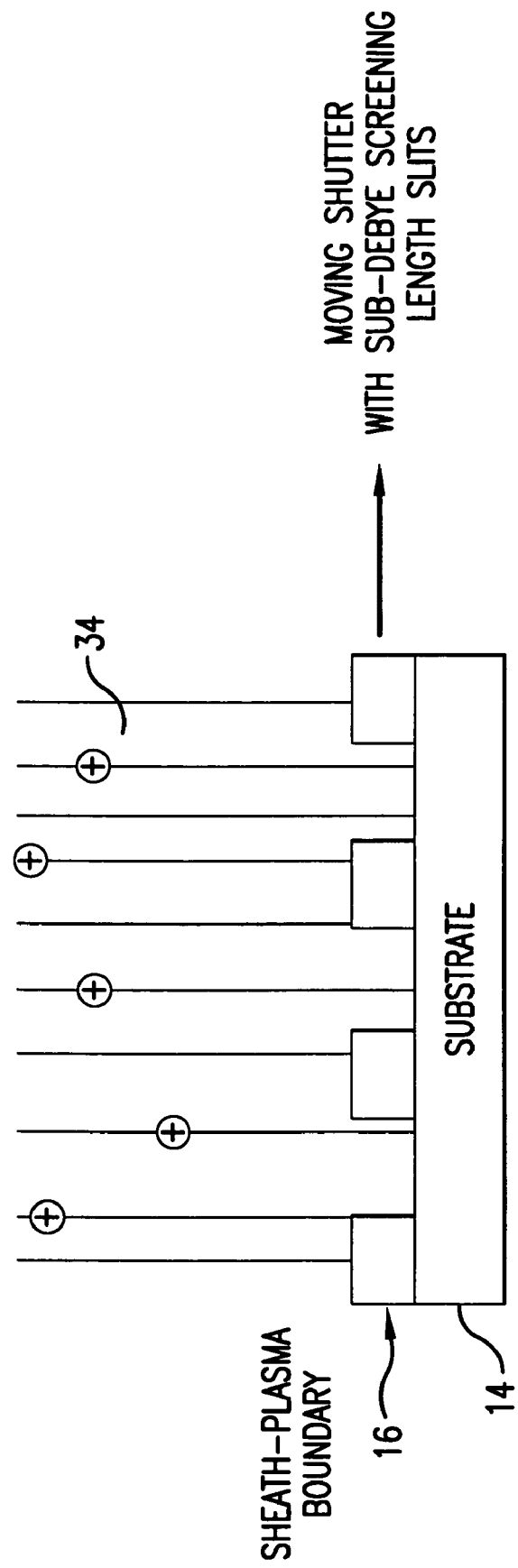
FIG. 11 is a schematic representation of the shutter in which the openings are smaller than the Debye screening length showing that little change in sheath property takes place over the open and closed portions of the shutter.

Unwanted perturbation is avoided in the present invention by patterning the shutter to form an array of openings through which the exposure of the substrate to the plasma occurs. These are smaller than the Debye screening length as shown in FIG. 11.

The Debye screening length is a well-known characteristic in the field of ionic systems which defines a characteristic distance beyond which the free ions change the shape of the potential energy, reducing to zero exponentially in a rapid manner. As long as there are a large quantity of ions between two charges their interaction is strongly (reduced) screened. This is due to the fact that the ions cannot terminate electric field lines. A free ion attracts ions from solution of opposite sign, forming a "counterion cloud" which neutralizes its charge, and therefore, by the Gauss's Law, basically eliminates the electric field. The size of this "cloud" is roughly the screening length $\lambda_D$ (Debye screening length), the parameters that determine when the exponential "cuts of" the Coulomb interaction in the solution with ions present. A useful formula for $\lambda_D$ is due to Debye, which comes from a certain relatively-easy-to-solve limiting case of interaction of charges with free ions present:

$$\lambda_D = \left( \frac{\varepsilon k_B T}{4\pi k e^2 \sum_i \rho_i z_i^2} \right)^{1/2} \quad (1)$$

where the sum over i is over all the types (species) of ions, and where $\rho_i$ and $z_i$ are the number densities and valencies of the various types of ions. As can be seen, as more ions are added, the screening length goes down due to the fact that the valences are squared. This formula is often called the Debye screening length, and provides a good first estimate of the distance beyond which Coulomb interactions can be essentially ignored, and the size of the region near a point charge where opposite-charge counterions can be found.

If the shutter 16 includes a plurality of slits with the widths of a sub-Debye screening length, little change in sheath properties over the open and closed portions of the shutter take place. Consequently, the energies and angular distributions of the ions transmitted through the openings of the moving shutter are essentially the same as those of ions incident on the solid surface portion of the shutter. This is due to the fact that the speed of the shutter, which has a typical lateral speed of approximately 0.00 1 m/s-10 m/s, is small relative to the velocity with which ions and neutrals travel through the opening (random gas velocity of Ar at room temperature is about 400 m/s).

Figure 12:
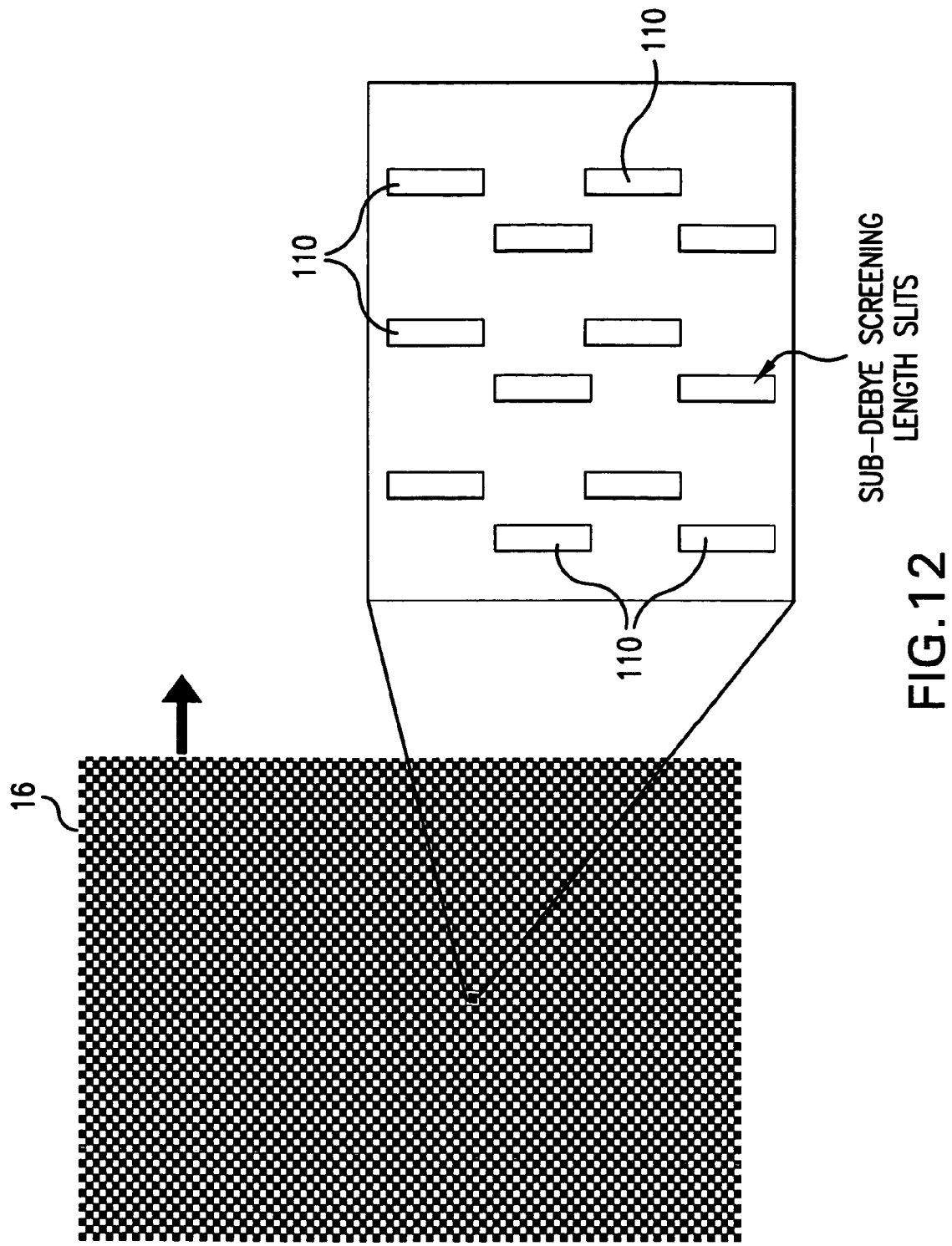
FIG. 12 shows a design of the patterned shutter with the slits smaller than Debye screening length.
Figure 13:
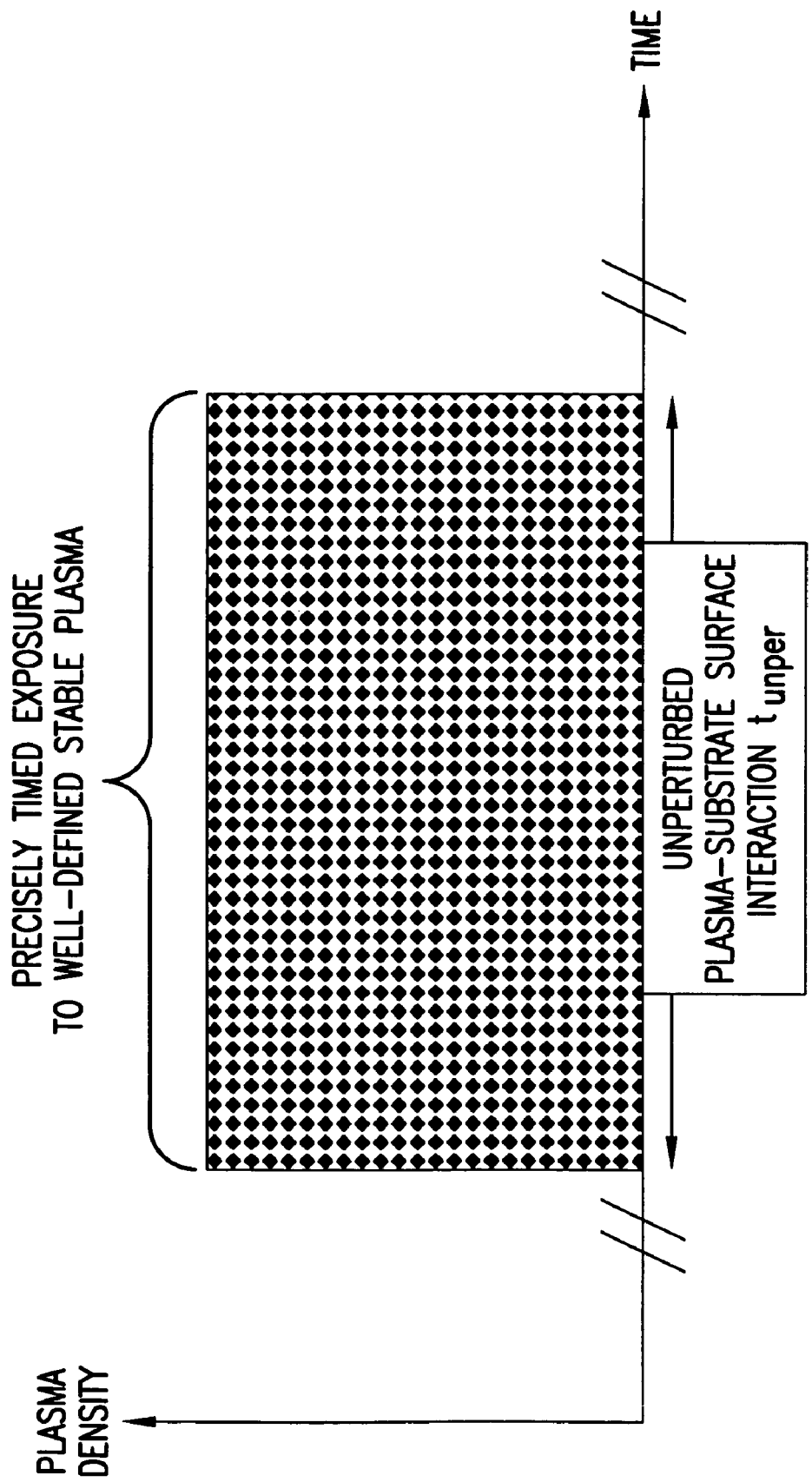
FIG. 13 is a diagram showing that as the patterned shutter with the Debye screening length moves across the substrate, no perturbations and unintentional changes of the plasma/surface interaction are introduced.

By patterning the shutter 16 with openings that have lateral dimensions smaller than the Debye screening length, an approach is provided by which a material surface can be exposed to the plasma for a controlled period of time. However, the plasma/surface interaction will not depend on the details of the motion of the shutter. The Debye screening length depends on the characteristics of the plasma and are determined for a particular plasma process to optimize the design of the shutter. However, lateral distances of the order 0.01 mm to 0.5 mm generally work well with a variety of plasmas often used for materials processing. A possible design of such a shutter is shown in FIG. 12. This shutter includes a plurality of slits 110 of the sub-Debye screening length. As the shutter 16 moves across the substrate, the changing boundary conditions will not lead to perturbations and unintentional changes of the plasma surface interactions as presented in FIG. 13. The same results are found when a substrate is displaced underneath a stationary shutter.

Although this invention has been described in connection with specific forms and embodiments thereof, it will be appreciated that various modifications other than those discussed above may be resorted to without departing from the spirit or scope of the invention as defined in the appended Claims. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A system for nanoscale plasma processing of objects, comprising:
   a plasma processing chamber;
   a plasma generating unit to create plasma in said plasma processing chamber;
   an object;
   a shutter positioned in close proximity to said object between said object and the plasma, said shutter being patterned to form at least one opening therein with a predetermined width thereof of sub-Debye screening length to substantially minimize perturbation of a plasma flux incident on the object, said shutter being commonly biased with said object relative to the plasma generating unit; and
   means for uniformly changing relative disposition between said shutter and said object to control the object/plasma interaction time.

2. The system of claim 1, wherein a distance between said shutter and said object is in the range of approximately 0-1 mm.

3. The system of claim 1, further comprising means coupled to said object for slidably translating said object relative to said shutter.

4. The system of claim 1, further comprising means coupled to said shutter for slidably translating said shutter relative to said object.

5. The system of claim 1, further comprising means for controlling velocity of relative movement between said shutter and said object.

6. The system of claim 1, wherein said plasma generating unit is a capacitively coupled plasma generating device.

7. The system of claim 1, wherein said plasma generating unit is an inductively coupled plasma generating device.

8. The system of claim 1, wherein said plasma generating unit is an electron cyclotron resonance plasma generating device.

9. The system of claim 1, wherein said plasma generating unit is a Helicon wave plasma generating device.

10. The system of claim 1, wherein said plasma generating unit is a high frequency capacitively coupled plasma generating device.

11. The system of claim 1, wherein said plasma generating unit is a microwave plasma generating device.

12. The system of claim 1, wherein said plasma generating unit is a hollow cathode plasma generating device.

13. The system of claim 1, wherein said plasma generating unit is an electron beam plasma generating device.

14. The system of claim 1, wherein said plasma generating unit is a remote plasma source.

15. The system of claim 1, wherein said plasma generating unit is a dielectric barrier discharge plasma source.

16. The system of claim 1, wherein said plasma generating unit is a microhollow cathode discharge plasma source.

17. The system of claim 1, wherein said plasma generating unit is an atmospheric pressure discharge plasma source.

18. The system of claim 1, wherein said shutter is made of a material from the group of materials including Ni, Si, $Si_3N_4$, $SiO_2$, Al, $Al_2O_3$, anodized aluminum, and combinations thereof.

19. The system of claim 1, wherein the thickness of said shutter is in the range of 1 μm-1 mm.

20. The system of claim 1, wherein said shutter including said at least one opening of said sub-Debye screening length formed therein is scanned over said object with a predetermined velocity to provide a controlled object/plasma interaction at a desired area of said object.

21. The system of claim 20, further including means for coordinating the predetermined width of said at least one opening with a velocity of changing the object/shutter relative disposition to control the object/plasma interaction time.

22. The system of claim 20, wherein said predetermined velocity is in the range of approximately 0.001 m/s-10 m/s.

23. The system of claim 1, further comprising means for providing the object/plasma interaction substantially at fully established steady plasma state.

24. The system of claim 1, wherein said shutter includes a shutter belt having at least one opening formed therein.

25. The system of claim 1, wherein said shutter includes a linear shutter.

26. The system of claim 25 wherein said linear shutter includes a single blade with at least one opening formed therein.

27. The system of claim 25, wherein said linear shutter includes at least two blades, each blade having a respective at least one opening formed therein, the relative movement of said two blades being coordinated to control the alignment and disalignment between said openings made in said two blades.

28. The system of claim 26, wherein the width of said slits is in the range of 0.01 mm to 0.5 mm.

29. The system of claim 1, wherein said shutter includes an axial shutter.

30. The system of claim 1, wherein the width of said at least one opening ranges between 0.1 mm and 50 mm.

31. The system of claim 1, further comprising:
a first electrode,
a second electrode displaced from said first electrode to form a plasma space therebetween, said second electrode including said object and said shutter, and
means for biasing said second electrode relative to said first electrode.

32. The system of claim 1, wherein said shutter includes an array of said at least one openings forming an array of slits of sub-Debye screening length.

33. A system for nanoscale plasma processing of objects, comprising:
a plasma processing chamber,
an object positioned in said plasma processing chamber,
a shutter disposed in close proximity to said object, said shutter being commonly biased with said object relative to a plasma source, said shutter being patterned to form an array of openings with widths of sub-Debye screening length to substantially minimize perturbation of a plasma flux incident on the object, and
means for uniformly changing relative disposition between said object and said shutter to control the object/plasma interaction through said shutter openings.

34. The system of claim 33, wherein the width of said openings is in the range of 0.01 mm to 0.5 mm.

35. The system of claim 33, further comprising:
a first electrode,
a second electrode displaced from said first electrode to form a plasma space therebetween, said second electrode including said shutter and said object, and
means for biasing said second electrode relative to the plasma in said plasma space to produce ion bombardment of said object through said openings of sub-Debye screening length width made in said shutter.

* * * * *